United States Patent

Schneider

[15] 3,679,914

[45] July 25, 1972

[54] REGENERATIVE CIRCUIT COMPRISING COMPLEMENTARY TRANSISTOR PAIRS

[72] Inventor: Herbert Anton Schneider, Boulder, Colo.

[73] Assignee: Bell Telephone Laboratories, Incorporated, Murray Hill, N.J.

[22] Filed: April 13, 1971

[21] Appl. No.: 133,518

[52] U.S. Cl...............................307/288, 307/237, 307/273, 307/291

[51] Int. Cl.....................................H03k 3/286, H03k 3/284

[58] Field of Search..................307/237, 241, 242, 273, 288, 307/289, 291, 292; 328/196, 200, 206, 207

[56] References Cited

UNITED STATES PATENTS

| | | | |
|---|---|---|---|
| 3,010,031 | 11/1961 | Baker | 307/291 X |
| 3,463,939 | 8/1969 | Sturman | 307/291 X |
| 2,948,820 | 8/1960 | Bothwell | 307/288 X |
| 3,474,261 | 10/1969 | Ryerson et al. | 307/292 X |
| 3,042,810 | 7/1962 | Rochelle | 307/291 X |
| 3,290,573 | 12/1966 | Kamens | 307/292 X |
| 3,488,513 | 1/1970 | Ryerson | 307/273 |
| 3,577,015 | 5/1971 | Niemann et al. | 307/288 X |

*Primary Examiner*—Donald D. Forrer
*Assistant Examiner*—L. N. Anagnos
*Attorney*—R. J. Guenther and Kenneth B. Hamlin

[57] ABSTRACT

Improved triggering circuitry is incorporated into a regenerative circuit comprising complementary transistor pairs. When the circuit is triggered, a switching sequence is established in which both ON transistors are turned OFF before either OFF transistor turns ON. Potential transistor and power supply damage during the state transition period are thereby avoided.

11 Claims, 4 Drawing Figures

INVENTOR
*H. A. SCHNEIDER*
BY
ATTORNEY

REGENERATIVE CIRCUIT COMPRISING COMPLEMENTARY TRANSISTOR PAIRS

BACKGROUND OF THE INVENTION

The present invention relates generally to regenerative circuits and particularly to regenerative circuits comprising complementary transistor pairs.

Known bistable regenerative circuits comprising complementary transistor pairs, sometimes referred to as "complementary cells," are arranged such that each transistor pair is conducting in one cell state and nonconducting in the other. Complementary cells obviate a number of the shortcomings of more conventional regenerative circuits which provide similar functions, e.g., the Eccles-Jordan flip-flop, and are particularly useful, for example, as one-bit memory elements. The output impedance of the complementary cell is low in both states, and its rise and fall times, and thus frequency response, are more independent of passive component values than in more conventional regenerative circuits. Other advantages of the complementary cell are lower internal power dissipation and the option of either single-ended or balanced outputs. In addition, the output levels are substantially the full power supply voltages. The above factors, and others, make the complementary cell an attractive alternative to the Eccles-Jordan type regenerative circuit in many applications.

Known complementary cells are triggered by techniques not unlike those used in conjunction with the Eccles-Jordan type circuit. Typically, a voltage pulse is applied to turn ON one of the two OFF transistors or to turn OFF one of the two ON transistors. Regenerative action is thereby initiated, all four transistors switch and a state transition is effected. It has been found that when a complementary cell is triggered in this fashion, two collector-connected transistors, or perhaps all four transistors, may be rendered simultaneously conductive during the period of transition between cell states. This effectively places a short circuit across the power supply, creating possible power supply ripple and causing large currents to surge through the transistors and power supply. A potential for transistor damage or destruction is thereby created and, unless the power supply is designed to withstand such current surges (usually at additional cost), damage thereto may also result.

A further drawback of known complementary cells is that the output levels are constrained to be essentially equal to the power supply voltages. Although this is an advantage in some applications, some degree of latitude and control of the output levels is often desirable.

Monostable circuits employing complementary transistor pairs are also known. Typically a reactive timing element is inserted in one of the cross-coupling paths of the bistable cell to achieve monostable operation. The disadvantages and drawbacks of such monostable circuits are substantially those of the above-mentioned bistable circuits.

SUMMARY OF THE INVENTION

It is therefore a general object of my invention to provide a simple, compact and economical regenerative circuit comprising complementary transistor pairs.

It is a more specific object of my invention to provide a complementary cell in which the potential for transistor and power supply damage is minimized.

It is another object of my invention to provide a complementary cell in which the peak power supply current drain is minimized.

It is yet another object of my invention to provide a complementary cell capable of output levels different from the power supply voltages.

It is a further object of my invention to provide a complementary cell suitable for fabrication in integrated circuit form.

These and other objects are achieved in a complementary cell including novel triggering circuitry for turning both ON transistors OFF. Thus, when the cell is triggered from a quiescent state, both ON transistors associated with that state are turned OFF substantially concurrently; and a positive feedback loop is established thereby which causes the originally OFF transistors to turn ON, completing the state transition. In contrast to known complementary cells, therefore, both ON transistors are assured to be OFF before either OFF transistor turns ON. Potential power supply ripple, as well as potential transistor and power supply damage, due to current surges arising during the state transition period, are thereby avoided.

In a specific embodiment of my invention, the emitter junction of each switching transistor of a bistable complementary cell is bridged by a controllable voltage clamp, illustratively another transistor. Thus saturation of a clamping transistor biases its associated switching transistor such that it is nonconductive. The clamping transistors are operated in pairs and each pair is operative for concurrent saturation. Thus, in accordance with the principles of my invention, saturation of a clamping transistor pair causes the switching transistor pair associated therewith (presumably ON, initially) to simultaneously turn OFF.

In accordance with a feature of my invention, each clamping transistor has the same conductivity type (n-p-n or p-n-p) as its associated switching transistor. Each clamping transistor pair may be thereby conveniently controlled by a triggering switch interconnecting the bases thereof. When the triggering switch is closed, the clamping pair associated therewith are concurrently saturated as current flows from the base of one clamping transistor, through the switch, and into the base of the other clamping transistor. Illustratively, each triggering switch is an electronic device such as a transistor, the input terminals of the two switches serving as the set and reset terminals of the cell.

In an illustrative monostable circuit embodiment in accordance with my invention, timing circuitry is coupled to the reset terminal of the complementary cell. When the cell is triggered from its normally quiescent reset state into its set state, a rising voltage is generated by the timing circuitry at the reset terminal. After a predetermined time interval, the potential at that terminal achieves sufficient magnitude to activate the reset triggering switch, and the cell returns to the reset state.

In accordance with an aspect of my invention, the complementary cell may be provided advantageously with cross-coupling impedances which allow for output levels which are variable within the range defined by the power supply levels.

In accordance with another aspect of my invention, auxiliary triggering switches may be connected between the bases of each switching transistor pair. Activation of an auxiliary triggering switch when inputs are also applied simultaneously to both the set and reset terminals of the cell, assures triggering into a predictable state.

BRIEF DESCRIPTION OF THE DRAWINGS

A clear understanding of my invention and of the preceding and other objects and features thereof may be gained from a consideration of the following detailed description and accompanying drawings in which.

DETAILED DESCRIPTION

Figure 1:
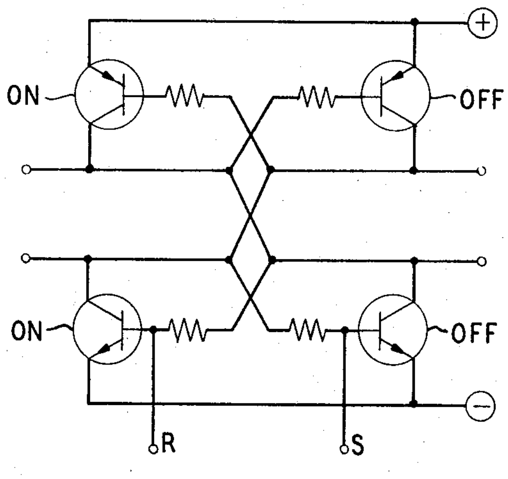
FIG. 1 PRIOR ART
FIG. 1 is a known bistable complementary cell.

FIG. 1 shows a known complementary cell in one of its two stable states; the left-hand transistor pair is ON and the right-hand transistor pair is OFF. The cell is typically triggered by a signal applied so as to turn ON one of the OFF transistors or to turn OFF one of the ON transistors. Regenerative action is thereby initiated, all four transistors switch and a state transition is effected. The disadvantages of this mode of triggering include possible transistor and/or power supply damage.

Figure 2:
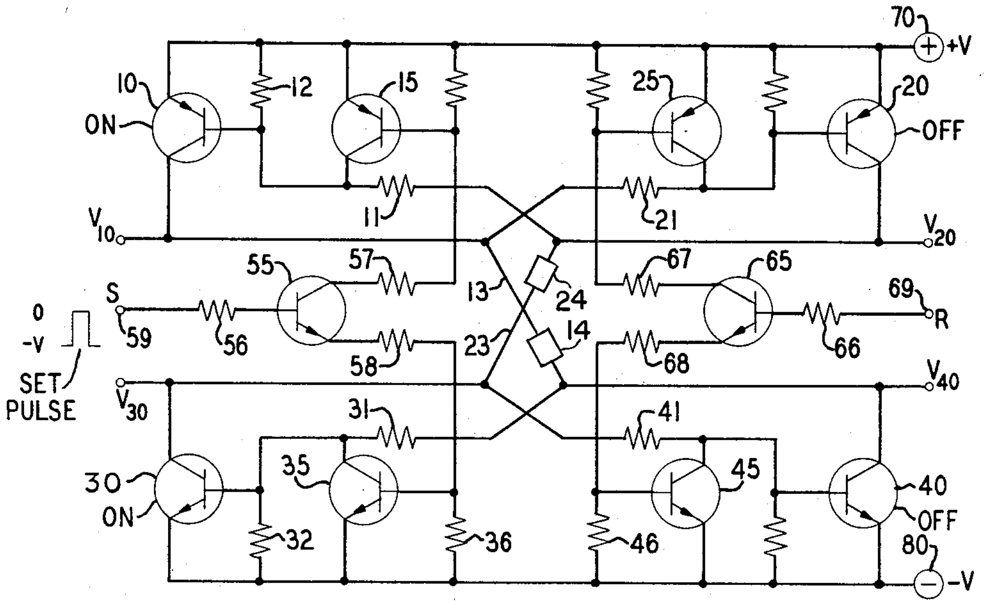
FIG. 2 is a preferred embodiment of a bistable complementary cell in accordance with my invention.

The complementary cell shown in FIG. 2, in accordance with my invention, avoids the above and other disadvantages of known complementary cells. The cell in FIG. 2 is a bistable flip-flop illustratively including p-n-p switching transistors 10 and 20 and n-p-n switching transistors 30 and 40, which correspond generally to the four transistors of the known cell in FIG. 1.

Transistors 10, 20, 30 and 40 are interconnected via resistors 11, 21, 31 and 41, which may be of equal value. The base of transistor 10 is connected to the collector of transistor 20 through resistor 11, and the base of transistor 20 is connected to the collector of transistor 10 through resistor 21. In corresponding fashion, the base and collector electrodes of transistors 30 and 40 are interconnected by resistors 31 and 41, respectively Additionally, the collectors of transistors 10 and 40 are connected via direct current conducting path 13 and the collectors of transistors 20 and 30 are connected via direct current conducting path 23.

The flip-flop is provided advantageously with balanced output capability by potential sources 70 and 80, which in the illustrative embodiment are of opposite polarity and have equal magnitude V. The emitters of transistors 10 and 20 are connected in common to positive potential source 70; and, in like manner, the emitters of transistors 30 and 40 are connected in common to negative potential source 80.

In accordance with my invention, the flip-flop in FIG. 2 is provided with triggering circuitry for concurrently turning OFF both of the ON transistors associated with one of the flip-flop states before either OFF transistor associated with the other state turns ON. The triggering circuitry includes clamping transistors 15 and 35 which, under the control of triggering transistor 55, operate concurrently to clamp respective switching transistors 10 and 30 in a nonconductive state. The triggering circuitry further includes clamping transistors 25 and 45 which operate concurrently, under the control of triggering transistor 65, to respectively render switching transistors 20 and 40 nonconductive.

The emitter and collector terminals of clamping transistors 15, 25, 35 and 45 are respectively connected to the emitter and base terminals of switching transistors 10, 20, 30 and 40, respectively. Resistors 57 and 58 respectively connect the bases of transistors 15 and 35 to the collector and emitter terminals of transistor 55; and, in like manner, resistors 67 and 68 respectively connect the bases of transistors 25 and 45 to the collector and emitter terminals of transistor 65.

Resistor 56 connects set terminal 59 to the base of transistor 55 and, in like manner, resistor 66 connects reset terminal 69 to the base of transistor 65. Output terminals $V_{10}$, $V_{20}$, $V_{30}$ and $V_{40}$ are respectively connected to the collectors of transistors 10, 20, 30 and 40.

The two triggering transistors 55 and 65 are shown as being of the n-p-n type. As such, the flip-flop is adapted for triggering from positive logic. Triggering from negative logic may be implemented by the use of p-n-p triggering transistors having emitter and collector connections which are the reverse of those shown in FIG. 2. The cell may, in fact, be provided with both n-p-n and p-n-p transistor triggering switches each having its own base resistor and triggering terminal, thereby making the cell immediately available for triggering from positive and/or negative logic as the application requires.

It will be hereinafter assumed, for the purposes of description, that transistors 55 and 65 are of the n-p-n type as shown in FIG. 2, and that the cell is thus adapted for triggering from positive logic. Illustratively, the "0" level is represented by a negative voltage substantially equal to source 80 and the "1" level is represented by a ground or near-ground potential. Thus, when both set terminal 59 and reset terminal 69 are at the "0" logic level, a negative voltage is extended through resistors 56 and 66, to the bases of transistors 55 and 65, respectively. Since source 80 is also extended to the emitters thereof through paths including resistors 58 and 68, respectively, both transistors 55 and 65 are OFF. All four clamping transistors are, therefore, also OFF and the flip-flop remains in a quiescent condition.

Assume, for purposes of illustration, the flip-flop is originally quiescent in its reset state. As indicated in FIG. 2, transistors 10 and 30 are ON, saturation base current being supplied to each through the collector of the other. Transistors 20 and 40 are OFF as a result of their cross-coupling with transistors 10 and 30, respectively.

In the reset state, output terminals $V_{10}$ and $V_{40}$ are at the voltage of source 70 and output terminals $V_{20}$ and $V_{30}$ are at the voltage of source 80.

The cell is transferred to the set state by application of a positive pulse to set terminal 59. As shown illustratively in FIG. 2, this pulse has an upper voltage level which is at ground or near-ground potential. With terminal 59 thus effectively grounded, the emitter junction of transistor 55 is forward-biased by source 80 through resistors 56 and 58 and the emitter junction of transistor 35 in parallel with its base resistor 36. Transistor 55 is thus switched into saturation and current provided from sources 70 and 80 flows from the base of clamping transistor 15, through transistor 55 via resistors 57 and 58, to the base of clamping transistor 35. The resultant simultaneous saturation of transistors 15 and 35 clamps the base terminals of switching transistors 10 and 30 to their respective emitter terminals such that the voltages across the emitter junctions of both switching transistors are insufficient to allow conduction therein, and transistors 10 and 30 turn OFF simultaneously.

The cell now enters a transition period. The collectors of all four switching transistors tend toward ground potential and the resultant change in voltage across resistors 21 and 41 provides additional base current for transistors 20 and 40. Therefore, the collector currents of those transistors also increase and, since the base current of transistor 20 is identical to the collector current of transistor 40 and vice versa, a positive feedback loop between transistors 20 and 40 is established. A cycle of increasing base and collector currents continues at an ever accelerating rate until, ultimately, transistors 20 and 40 both reach saturation.

The cell is thus set. Since transistors 20 and 40 have come into saturation, transistors 10 and 30 will be held OFF in the same manner that the latter pair of transistors held OFF the former when the cell was reset. The clamping action of transistors 15 and 35 is no longer required to hold transistors 10 and 30 OFF and the signal at set terminal 59 may thus be returned to the "0" logic level. The output voltages in the set state are the opposite of what they were in the reset state; terminals $V_{10}$ and $V_{40}$ are at the voltage level of source 80 and terminals $V_{20}$ and $V_{30}$ are at the voltage level of source 70.

Since the cell is symmetrical, it is reset in a manner substantially similar to the way it is set. A pulse applied to reset terminal 69 activates clamping action by transistors 25 and 45, and transistors 20 and 40, originally ON in the set state, are simultaneously turned OFF. This establishes a positive feedback loop between transistors 10 and 30 which thereupon saturate. Since transistors 20 and 40 are held OFF thereby, the clamping action of transistors 25 and 45 is no longer required to hold transistors 20 and 40 OFF and the signal at reset terminal 69 may be terminated, thus completing the transition.

If triggering signals are simultaneously applied to both set terminal 59 and reset terminal 69, transistors 10, 20, 30 and 40 will all be held OFF, and since the state in which the cell will finally come to rest will then depend on which triggering signal terminates first, ambiguous states may result. The problem is alleviated by connection of auxiliary triggering circuitry, similar to that comprising transistors 55 or 65, between the bases of transistors 10 and 30, and likewise between the bases of transistors 20 and 40. If triggering signals are applied simultaneously to terminals 59 and 69, activation of one of the auxiliary triggering switches will provide saturation base current to the switching transistor pair connected thereto. Thus, the cell will predictably come to rest in the state defined by the conduction of that transistor pair.

Operation of known monostable circuits comprising complementary transistor pairs may be somewhat improved by triggering those circuits in accordance with my invention. Transistor and/or power supply damage during the transition from the stable state to the quasi-stable state is avoided by simultaneously turning OFF the two transistors which are ON in the stable state to effect the transition. However, these same problems, among others, may uncontrollably arise during the transition back to the stable state.

Figure 3:
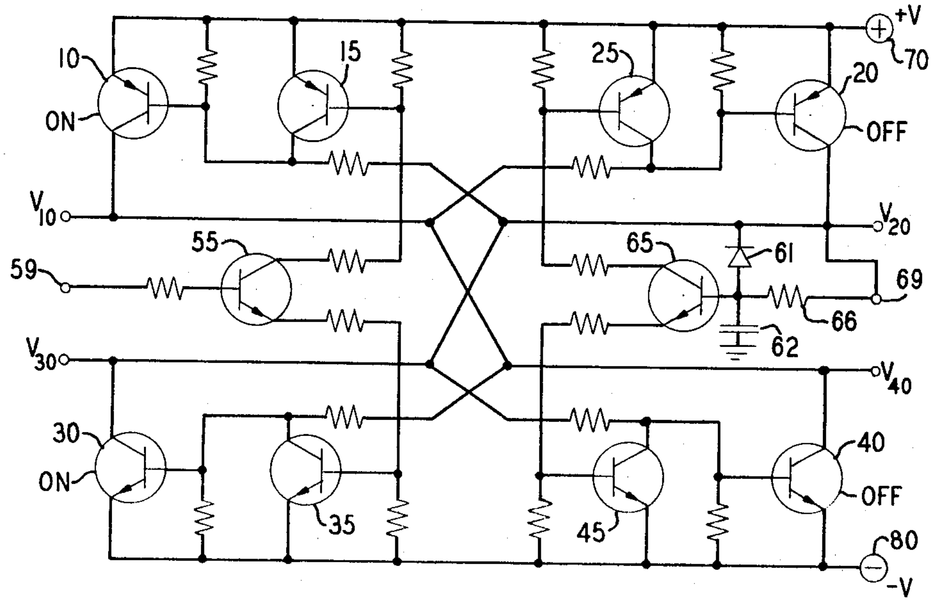
FIG. 3 shows an illustrative monostable circuit in accordance with my invention.

Accordingly a more advantageous monostable circuit is shown in FIG. 3. The monostable circuit includes the bistable cell of FIG. 2 which is adapted for monostable operation by the addition of timing circuitry, including diode 61 and capacitor 62. Diode 61 connects the collector of transistor 20 to the base of transistor 65, which is in turn coupled to ground through capacitor 62. In addition, reset terminal 69 is directly connected to the collector of transistor 20.

In operation, the monostable circuit is initially quiescent in its reset state as illustrated in FIG. 3. When the cell is triggered into its set state, the voltage at terminal 69 (originally that of source 80) begins to rise toward source 70, the collector voltage of transistor 20, with a time constant primarily determined by capacitor 62 and resistor 66. As the potential at terminal 69 approaches ground, transistor 65 is forward-biased just as if an external reset pulse had been applied thereto. The quasi-stable (set) state is terminated by the resultant clamping action of transistors 25 and 45, and the cell returns to its original stable (reset) state. The cell may be retriggered after a short settling period during which capacitor 62 recharges through diode 61 and transistor 30.

In known complementary cells the output levels are typically the same as the full supply voltages. However, in some applications greater versatility and control of the output levels is desirable. For such applications, the complementary cell of FIG. 2 may be modified advantageously by insertion of an impedance either linear or nonlinear in one or both conducting paths 13 and 23, as depicted illustratively by impedances 14 and 24, respectively.

If, for example, resistors are inserted in both conducting paths 13 and 23, the output levels obtaining at the collectors of both transistors which are OFF in a given state are less than the full supply voltages. When the cell thus modified is (for example) reset, as indicated in FIG. 2, sources 70 and 80 are effectively bridged by two voltage divider networks. The first voltage divider network comprises resistors 31 and 32 and the resistor in conducting path 13. The second comprises resistors 11 and 12 and the resistor in conducting path 23. The voltages obtaining at terminals $V_{20}$ and $V_{40}$ are thus respectively determined by the resistors in each voltage dividing network, and may be controlled by varying the values of the voltage divider resistors, preferably the resistors in conducting paths 13 and 23.

Although only four output terminals are shown illustratively in FIG. 2, the number may be increased if desired for particular applications. For example, a combination of serially connected resistors may be inserted in both conducting paths 13 and 23 with auxiliary output terminals connected to each resistor-resistor junction. The cell will thus be provided with different level output signals at each auxiliary output terminal, the respective voltage levels being determined by the resistor values chosen. Both upper and lower voltage levels at the auxiliary output terminals will be less than the full supply voltages.

Figure 4:
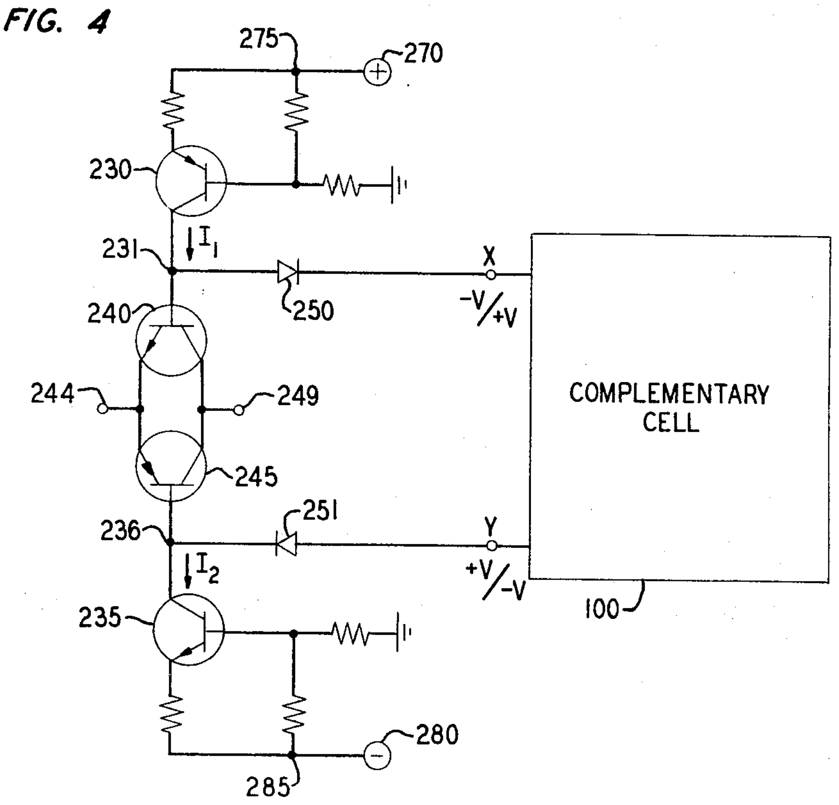
FIG. 4 shows a complementary cell according to my invention employed as the actuating means in an electronic relay.

The balanced output capability of the complementary cell is advantageously employed in applications such as the electronic relay shown in FIG. 4, which includes complementary cell 100 as its memory. Cell 100 may be, for example, the complementary cell shown in FIG. 2 with the cell output terminals X and Y in FIG. 4 corresponding to terminals $V_{10}$ and $V_{30}$ of FIG. 2. The contact element of the relay is a complementary transistor pair comprising n-p-n transistor 240 and p-n-p transistor 245. The emitters of transistors 240 and 245 are connected in common, and their common point serves as signal terminal 244 of the relay. The collectors of transistors 240 and 245 are also connected in common and their common point serves as signal terminal 249. Transistors 230 and 235 and their associated circuitries, including sources 270 and 280, provide essentially equal currents $I_1$ and $I_2$ at nodes 231 and 236, respectively. Diodes 250 and 251 respectively connect cell output terminals X and Y to nodes 231 and 236. The diodes are poled such that the anode of diode 250 is connected to node 231 and the cathode of diode 251 is connected to node 236.

When the complementary cell is in one state, its output terminals X and Y are at potentials −V and +V, respectively. Diodes 250 and 251 are therefore forward-biased and currents $I_1$ and $I_2$ are respectively diverted therethrough. There being no source of base current therefor, transistors 240 and 245 are OFF and the path between terminals 244 and 249 is open.

When the cell is in its other state, the potentials at terminals X and Y are reversed and diodes 250 and 251 are thus back-biased. The current $I_1$ flows into the base of transistor 240 and the current $I_2$ flows out of the base of transistor 245. Those transistors are thus saturated and the path between terminals 244 and 249 is closed.

The electronic relay of FIG. 4 may be advantageously modified to eliminate the need for sources 270 and 280, by providing in their stead direct connections from terminals X and Y to nodes 275 and 285 respectively. When terminals X and Y are at potentials −V and +V respectively, transistors 230 and 235 are reverse-biased. No current flows therethrough and hence the path between terminals 244 and 249 is open. When the signal polarities at terminals X and Y are reversed, the path between terminals 244 and 249 is closed in substantially the same manner as described above.

The specific circuitry shown herein is merely illustrative of the principles of my invention. It is to be understood that any number of different arrangements for simultaneously rendering a pair of transistors nonconducting may be employed to trigger complementary transistor regenerative circuits, both bistable and monostable, without departing from the scope of my invention.

What is claimed is:

1. In combination, first and second complementary transistor pairs, first circuit means operative for switching both transistors of said first pair substantially concurrently to a nonconducting state, network means including direct current paths for interconnecting said first and second transistor pairs such that said first pair is nonconducting when said second pair is conducting and vice versa, and triggering means including said first circuit means and said network means for switching said second pair to a transition state only after both transistors of said first pair have been switched to a nonconducting state.

2. The combination in accordance with claim 1, further comprising second circuit means operative for switching both transistors of said second pair substantially concurrently to a nonconducting state, and means including said interconnecting means for switching said first pair of transistors to a conducting state responsive to the switching of said second pair of transistors to a nonconducting state.

3. The combination in accordance with claim 1 wherein said first circuit means comprises clamping means connected to said first pair of transistors operative for biasing both transistors of said first pair nonconducting, and means for operating said clamping means.

4. In combination, first and second complementary transistor pairs, first circuit means operative for switching both transistors of said first pair substantially concurrently to a nonconducting state, said first circuit means comprising clamping means connected to said first pair of transistors operative for biasing both transistors of said first pair nonconducting, said clamping means comprising a complementary pair of clamping transistors respectively connected to the two transistors of said first pair, means for operating said clamping means comprising means for switching said pair of clamping transistors to a conducting state substantially concurrently, and means including direct current paths for interconnecting said first and second transistor pairs such that the switching of said second pair to a nonconducting state causes said second pair to switch to a conducting state.

5. The combination in accordance with claim 4 further comprising second circuit means operative for switching both transistors of said second pair substantially concurrently to a nonconducting state, and means including said interconnecting means for switching said first pair of transistors to a conducting state responsive to the switching of said second pair to a nonconducting state.

6. The combination in accordance with claim 5 further comprising means for operating said second circuit means in response to the switching of said second transistor pair from a nonconducting to a conducting state, whereby said second pair is returned to said nonconducting state.

7. The combination in accordance with claim 6 wherein said means for operating said second circuit means comprises timing circuit means for controlling the period of time said second pair is in said conducting state.

8. A regenerative switching circuit having first and second states including, first, second, third and fourth transistors, said first and third transistors comprising a first pair of complementary transistors which are conducting in said first state, and said second and fourth transistors comprising a second pair of complementary transistors which are conducting in said second state, means interconnecting said first and second transistor pairs such that said second pair is nonconducting when said first pair is conducting, and vice versa, said interconnecting means including a first direct current path interconnecting said first and fourth transistors and a second direct current path interconnecting said second and third transistors, first circuit means connected to said first pair operative for effecting transitions from said first state to said second state by switching both transistors of said first pair to a nonconducting condition substantially concurrently, and means including said first circuit means and said interconnecting means for switching said second pair to a transition state only after both transistors of said first pair have been switched to a nonconducting state.

9. A regenerative switching circuit in accordance with claim 8 wherein said first circuit means comprises clamping means connected to said first pair of transistors operative for biasing both transistors of said first pair nonconducting, and means for operating said clamping means.

10. A regenerative switching circuit in accordance with claim 8 further comprising output means connected to at least one of said direct current paths and impedance means connected in said one of said direct current paths, said one of said direct current paths comprising means for interconnecting the collectors of said first and fourth transistors, whereby the voltage at said output means is controlled by said impedance means.

11. A regenerative switching circuit having first and second states including, first, second, third and fourth transistors, said first and third transistors comprising a first pair of complementary transistors which are conducting in said first state, and said second and fourth transistors comprising a second pair of complementary transistors which are conducting in said second state, means interconnecting said first and second transistor pairs such that said second pair is nonconducting when said first pair is conducting, and vice versa, said interconnecting means including a first direct current path interconnecting said first and fourth transistors and a second direct current path interconnecting said second and third transistors, first circuit means connected to said first pair operative for effecting transitions from said first state to said second state by switching both transistors of said first pair to a nonconducting condition substantially concurrently, said first circuit means comprising clamping means connected to said first pair of transistors operative for biasing both transistors of said first pair nonconducting, and means for operating said clamping means, said clamping means comprising a complementary pair of clamping transistors respectively connected to said first and third transistors, and said operating means comprising switching means for interconnecting the bases of said pair of clamping transistors such that activation of said switching means causes said pair of clamping transistors to switch to a conducting state substantially concurrently.

* * * * *